(12) United States Patent
Dong et al.

(10) Patent No.: US 8,476,576 B2
(45) Date of Patent: Jul. 2, 2013

(54) OPTICAL DEVICE HAVING PARTIALLY BUTT-COUPLED LIGHT SENSOR

(75) Inventors: Po Dong, Arcadia, CA (US); Dazeng Feng, Arcadia, CA (US); Ning-Ning Feng, Arcadia, CA (US); Dawei Zheng, Arcadia, CA (US); Mehdi Asghari, San Marino, CA (US)

(73) Assignee: Kotura, Inc., Monterey Park, CA (US)

( * ) Notice: Subject to any disclaimer, the term of this patent is extended or adjusted under 35 U.S.C. 154(b) by 446 days.

(21) Appl. No.: 12/799,633

(22) Filed: Apr. 28, 2010

(65) Prior Publication Data
US 2011/0266422 A1 Nov. 3, 2011

(51) Int. Cl.
G02B 6/26 (2006.01)

(52) U.S. Cl.
USPC .............. 250/227.24; 250/227.11; 250/216; 385/8; 385/15

(58) Field of Classification Search
USPC ............ 250/227.11, 227.24, 227.2, 227.27, 250/216; 257/431, 432, 436; 385/14, 15, 385/4, 5, 8, 9, 116
See application file for complete search history.

(56) References Cited

U.S. PATENT DOCUMENTS

| | | | | |
|---|---|---|---|---|
| 6,154,582 A * | 11/2000 | Bazylenko et al. | ............. | 385/14 |
| 6,759,675 B2 * | 7/2004 | Csutak et al. | .................. | 257/21 |
| 6,970,611 B1 * | 11/2005 | Van Der Vliet et al. | ........ | 385/14 |
| 7,599,596 B1 * | 10/2009 | Feng et al. | .................... | 385/132 |
| 2005/0259910 A1 * | 11/2005 | Li et al. | ............................ | 385/14 |
| 2006/0039666 A1 * | 2/2006 | Knights et al. | ................ | 385/129 |

* cited by examiner

Primary Examiner — Francis M Legasse, Jr.
(74) Attorney, Agent, or Firm — Gavrilovich Dodd & Lindsey, LLP

(57) ABSTRACT

An optical device includes a light-transmitting medium positioned on a base. The light-transmitting medium defines a waveguide. The optical device also includes a light sensor. The light sensor includes a light-absorbing medium positioned on the base. A portion of the waveguide ends at a facet such that a first portion of a light signal being guided by the wavegide passes through the facet and a second portion of the light signal bypasses the facet and remains in the light-transmitting medium. The light-absorbing medium is positioned on the light-transmitting medium such that the light-transmitting medium is between the light-absorbing medium and the base. Additionally, the light-absorbing medium is positioned on the light-transmitting medium such that the light-absorbing medium receives the first portion of the light signal that passes through the facet. Further, the light-absorbing medium is configured such that the second portion of the light signal is coupled into the light-absorbing medium from the light-transmitting medium.

17 Claims, 9 Drawing Sheets

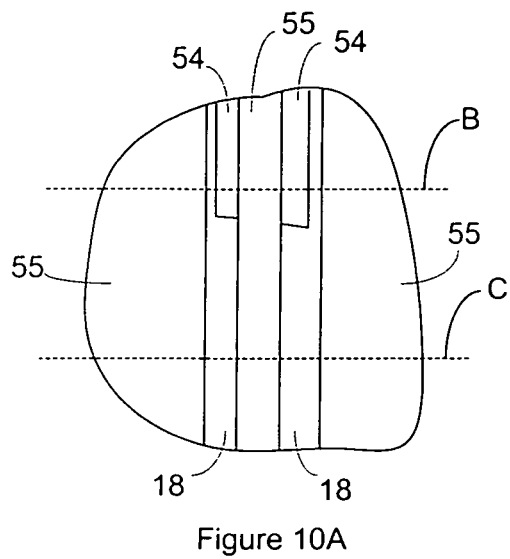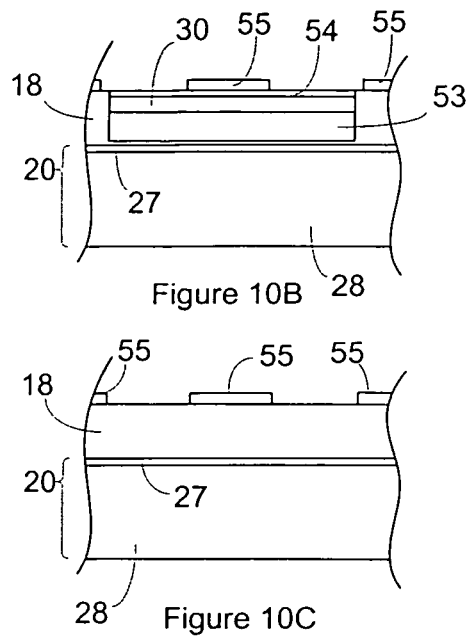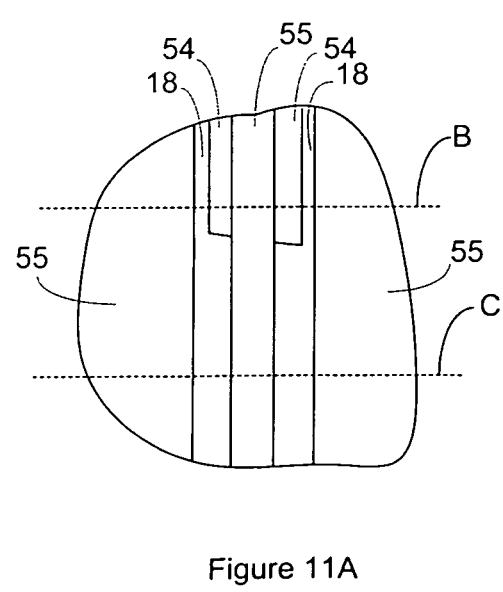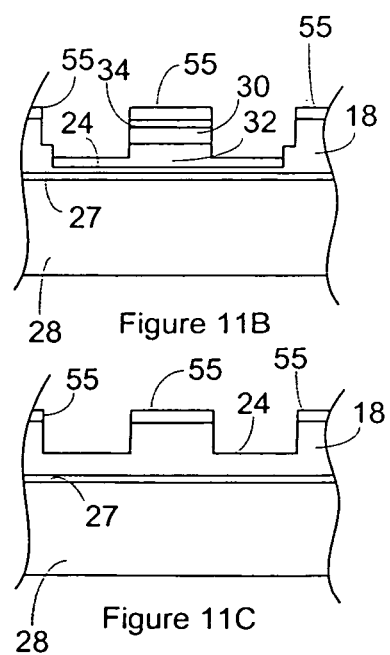
Figure 10A
Figure 10B
Figure 10C
Figure 11A
Figure 11B
Figure 11C

OPTICAL DEVICE HAVING PARTIALLY BUTT-COUPLED LIGHT SENSOR

GOVERNMENT SUPPORT

This invention was made with Government support under Agreement No. HR0011-08-9-0001 awarded by DARPA. The Government has certain rights in this invention.

FIELD

The present invention relates to optical devices and more particularly to devices having a light sensor.

BACKGROUND

The use of optical and/or optoelectronic devices is increasing in communications applications. These devices can include light sensors that receive light signals from a waveguide. These light sensors often employ a light-absorbing material that absorbs the received light signals. During operation of the light sensor, an electrical field is applied across the light-absorbing material. When the light-absorbing material absorbs a light signal, an electrical current flows through the light-absorbing material. As a result, the level of electrical current through the light-absorbing material indicates the intensity of light signals being received by the light-absorbing material.

The waveguides on optical and/or optoelectronic devices are often made of silicon. Because silicon does not absorb the light signals having the wavelengths that are used in communications applications, silicon is often not effective for use as the light-absorbing medium in the light sensors for communications application. In contrast, germanium is a material that can absorb these light signals and is accordingly often used as the light-absorbing medium in the light sensors for communications application.

These light sensors have been able to achieve adequate speeds when the waveguides have a cross-section with submicron dimensions. However, these light sensors are associated with undesirably high optical loss when used with waveguides having these dimensions. Further, the waveguides used in many communications applications employ larger waveguides. When these light sensors are used with larger waveguides, they generally lose speed and become associated with undesirable levels of dark current. Further, these light sensors can have an undesirably low sensitivity at low light levels.

For the above reasons, there is a need for improved light sensors.

SUMMARY

An optical device includes a light-transmitting medium positioned on a base. The light-transmitting medium defines a waveguide. The optical device also includes a light sensor. The light sensor includes a light-absorbing medium positioned on the base. A portion of the waveguide ends at a facet such that a first portion of a light signal being guided by the wavegide passes through the facet and a second portion of the light signal bypasses the facet and remains in the light-transmitting medium. The light-absorbing medium is positioned on the light-transmitting medium such that the light-transmitting medium is between the light-absorbing medium and the base. Additionally, light-absorbing medium is positioned on the light-transmitting medium such that the light-absorbing medium receives the first portion of the light signal that passes through the facet. Further, the light-absorbing medium is configured such that after the second portion of the light signal bypasses the facet, the second portion of the light signal is coupled upward into the light-absorbing medium from the light-transmitting medium.

BRIEF DESCRIPTION OF THE FIGURES

FIG. 1A is a perspective view of the device.

FIG. 1B is a cross-section of the light sensor shown in FIG. 1A taken along the line labeled B.

FIG. 1C is a cross-section of the device shown in FIG. 1A taken along the line labeled C.

FIG. 1D is a cross-section of the optical device shown in FIG. 1C taken along the line labeled C and extending parallel to the longitudinal axis of the waveguide.

FIG. 1E is a cross-section of the optical device shown in FIG. 1B taken along the line labeled E and extending parallel to the longitudinal axis of the waveguide.

FIG. 3A is a cross-section of the light sensor.

FIG. 3B is a cross-section of the light sensor shown on FIG. 3A taken at a different location along the length of the light sensor than the cross section shown in FIG. 3A.

FIG. 6A through FIG. 13C illustrate methods for forming optical devices having a light sensor constructed according to FIG. 1A through FIG. 1E.

DESCRIPTION

An optical device includes a light-transmitting medium positioned on a base. The light-transmitting medium defines a waveguide. The device also includes a light sensor. The light sensor includes a light-absorbing medium positioned on the light-transmitting medium such that the light-transmitting medium is between the light-absorbing medium and the base. Further, the light-absorbing medium is configured such that the light signal is coupled upward into the light-absorbing medium from the underlying light-transmitting medium. The light sensor is configured such that an electrical field is formed between the top of the light-absorbing medium and the bottom of the light-absorbing medium. The light-absorbing medium can be thinner than the waveguide. As a result, the electrical field is formed across a medium that is thinner than the waveguide. The reduce dimension of the light-absorbing medium relative to the waveguide means the light sensor can be used with larger waveguides without the light sensor experiencing the drop in speed and/or undesirable levels of dark current that is normally associated with adapting light sensors to larger waveguide.

Additionally, the waveguide can be partially butt coupled with the light-absorbing medium. For instance, a portion of the light-transmitting medium that defines the waveguide can end at a facet such that a first portion of a light signal being guided by the wavegide passes through the facet and a second portion of the light signal bypasses the facet and remains in the light-transmitting medium. The light-absorbing medium can be positioned on the light-transmitting medium such that the light-absorbing medium receives the first portion of the light signal that passes through the facet. The portion of the light-absorbing medium that receives the first portion of the light signal is butt-coupled to the waveguide. This partial butt coupling of the waveguide increases the efficiency at which the light signal is transferred into the light-absorbing medium. Increasing this efficiency allows the light sensor to be shorter and accordingly more compact.

Figure 1A:
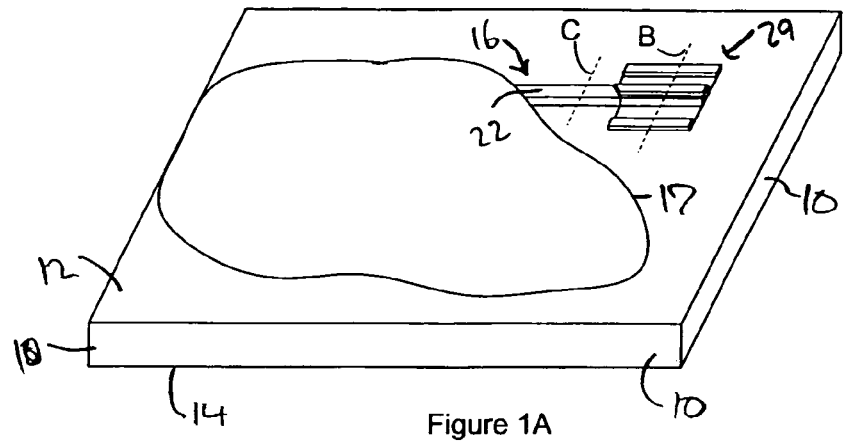
FIG. 1A through FIG. 1E illustrate an optical device having a light sensor configured to receive light signals from a waveguide. The light sensor includes a doped region in a light-absorbing medium and another doped region in a light-transmitting medium.
Figure 1B:
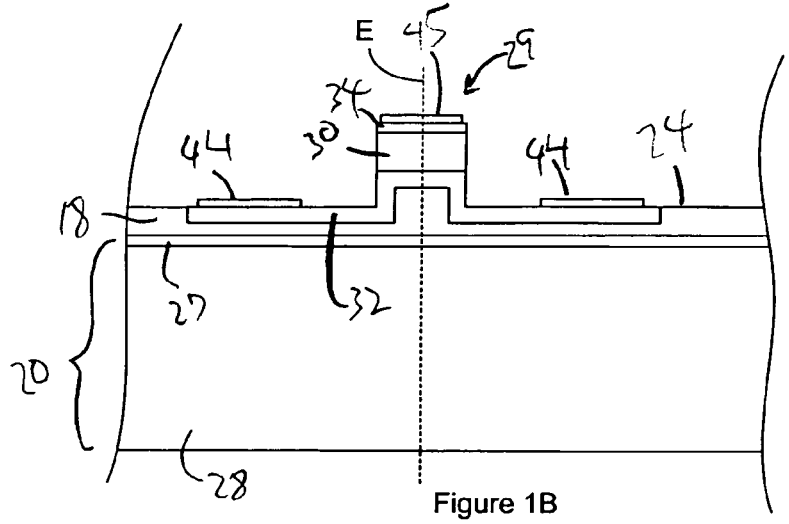
Figure 1C:
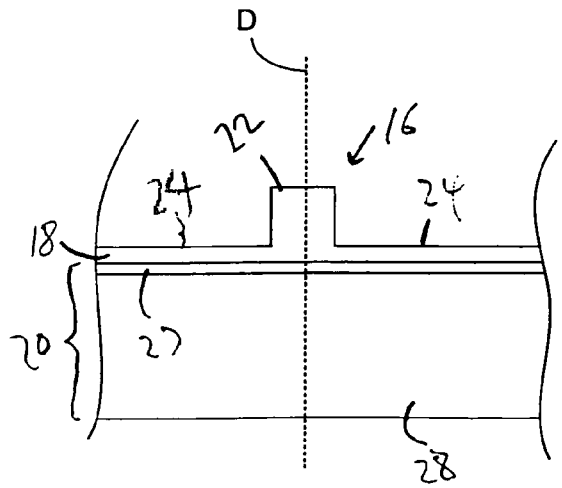
Figure 1D:
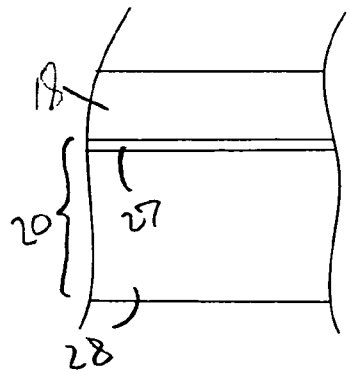
Figure 1E:
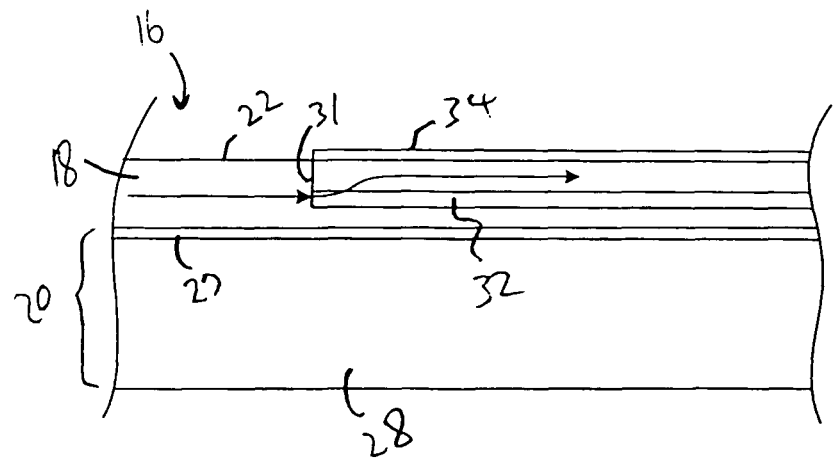

FIG. 1A through FIG. 1E illustrate an optical device having a light sensor configured to receive light signals from a waveguide. FIG. 1A is a perspective view of the device. FIG. 1B is a cross-section of the light sensor. For instance, FIG. 1B is a cross-section of the device shown in FIG. 1A taken along the line labeled B. FIG. 1C is a cross-section of the device shown in FIG. 1A taken along the line labeled C. FIG. 1D is a cross-section of the optical device shown in FIG. 1C taken along the line labeled C and extending parallel to the longitudinal axis of the waveguide. FIG. 1E is a cross-section of the optical device shown in FIG. 1B taken along the line labeled E and extending parallel to the longitudinal axis of the waveguide.

The device is within the class of optical devices known as planar optical devices. These devices typically include one or more waveguides immobilized relative to a substrate or a base. The direction of propagation of light signals along the waveguides is generally parallel to a plane of the device. Examples of the plane of the device include the top side of the base, the bottom side of the base, the top side of the substrate, and/or the bottom side of the substrate.

The illustrated device includes lateral sides 10 (or edges) extending from a top side 12 to a bottom side 14. The propagation direction of light signals along the length of the waveguides on a planar optical device generally extends through the lateral sides 10 of the device. The top side 12 and the bottom side 14 of the device are non-lateral sides.

The device includes one or more waveguides 16 that carry light signals to and/or from optical components 17. Examples of optical components 17 that can be included on the device include, but are not limited to, one or more components selected from a group consisting of facets through which light signals can enter and/or exit a waveguide, entry/exit ports through which light signals can enter and/or exit a waveguide from above or below the device, multiplexers for combining multiple light signals onto a single waveguide, demultiplexers for separating multiple light signals such that different light signals are received on different waveguides, optical couplers, optical switches, lasers that act a source of a light signal, amplifiers for amplifying the intensity of a light signal, attenuators for attenuating the intensity of a light signal, modulators for modulating a signal onto a light signal, light sensors that convert an light signal to an electrical signal, and vias that provide an optical pathway for a light signal traveling through the device from the bottom side 14 of the device to the top side 12 of the device. Additionally, the device can optionally, include electrical components. For instance, the device can include electrical connections for applying a potential or current to a waveguide and/or for controlling other components on the optical device.

The waveguide 16 is defined in a light-transmitting medium 18 positioned on a base 20. For instance, the waveguide 16 is partially defined by a ridge 22 extending upward from slab regions of the light-transmitting medium 18. In some instances, the top of the slab regions are defined by the bottom of trenches 24 extending partially into the light-transmitting medium 18 or through the light-transmitting medium 18. Suitable light-transmitting media 18 include, but are not limited to, silicon, polymers, silica, SiN, GaAs, InP and LiNbO$_3$. One or more cladding layers (not shown) are optionally positioned on the light-transmitting medium 18. The one or more cladding layers can serve as a cladding for the waveguide 16 and/or for the device. When the light-transmitting medium 18 is silicon, suitable cladding layers include, but are not limited to, silicon, polymers, silica, SiN, GaAs, InP and LiNbO$_3$.

The portion of the base 20 adjacent to the light-transmitting medium 18 is configured to reflect light signals from the waveguide 16 back into the waveguide 16 in order to constrain light signals in the waveguide 16. For instance, the portion of the base 20 adjacent to the light-transmitting medium 18 can be an optical insulator 27 with a lower index of refraction than the light-transmitting medium 18. The drop in the index of refraction can cause reflection of a light signal from the light-transmitting medium 18 back into the light-transmitting medium 18. The base 20 can include the optical insulator 27 positioned on a substrate 28. As will become evident below, the substrate 28 can be configured to transmit light signals. For instance, the substrate 28 can be constructed of a light-transmitting medium 18 that is different from the light-transmitting medium 18 or the same as the light-transmitting medium 18. In one example, the device is constructed on a silicon-on-insulator wafer. A silicon-on-insulator wafer includes a silicon layer that serves as the light-transmitting medium 18. The silicon-on-insulator wafer also includes a layer of silica positioned on a silicon substrate. The layer of silica can serving as the optical insulator 27 and the silicon substrate can serve as the substrate 28.

The optical device also includes a light sensor 29 configured to receive a light signal guided by the one or more waveguides 16. The light sensor 29 is configured to convert the light signal to an electrical signal. Accordingly, the light signal can be employed to detect receipt of light signals. For instance, the light sensor 29 can be employed to measure the intensity of a light signal and/or power of a light signal. Although FIG. 1A illustrates a waveguide 16 carrying the light signal between the one or more components and the light sensor 29, the device can be constructed such that the waveguide 16 carries the light signal directly from an optical fiber to the light sensor 29.

The light sensor 29 includes a light-absorbing medium 30 positioned to receive light from the waveguide. For instance, all or a portion of the ridge 22 of the light-transmitting medium 18 can terminate at a facet 31 and the light-absorbing medium 30 can be positioned to receive the light signals that travel through the facet. Additionally, the light-absorbing medium 30 is located on top of the light-transmitting medium 18 such that the light-transmitting medium 18 is located between the base and the light-absorbing medium 30. As a result, a portion of the light signal traveling through the waveguide enters the light-absorbing medium 30 through the facet while another portion of the light signal bypasses the facet and remains in the light-transmitting medium 18. The arrow in FIG. 1E represents the fundamental mode of a light signal entering the light sensor and traveling through the light sensor. As is evident from the arrow in FIG. 1E, light-absorbing medium 30 is configured such that the fundamental mode is coupled upward into the light-absorbing medium 30 from the light-transmitting medium as the light signal travels beyond the facet. For instance, the index of refraction of the light-absorbing medium 30 can be higher than the index of refraction of the light-transmitting medium 18. Further, the light-absorbing medium 30 can be configured such that the light-absorbing medium 30 defines a waveguide on top of the light-transmitting medium 18 so the light-absorbing medium 30 guides the portion of the light signal that enters the light-absorbing medium 30. Increasing the length of the light sensor increases the portion of the light signal that is coupled into the light-absorbing medium 30.

The light-transmitting medium 18 includes a first doped region 32 positioned in a portion of the light-transmitting medium 18 located between the light-absorbing medium 30 and the base. In some instances, the first doped region 32 contacts the light-absorbing medium 30. The light-absorbing medium 30 includes a second doped region 34. A portion of the light-absorbing medium 30 is located between the second doped 34 region and the first doped region 32. In particular, the portion of the light-absorbing medium 30 is located between the second doped region and the light-transmitting medium 18. In some instances, the second doped region 34 contacts the top of the light-absorbing medium 30.

When the first doped region 32 includes an n-type dopant, the second doped region 34 includes a p-type dopant and when the first doped region 32 includes a p-type dopant, the second doped region 34 includes an n-type dopant. Suitable dopants for N-type regions include, but are not limited to, phosphorus and/or arsenic. Suitable dopants for P-type regions include, but are not limited to, boron. A suitable concentration of carriers in the p-type region includes values greater than $1\times10^{14}/cm^3$, $1\times10^{16}/cm^3$, $1\times10^{17}/cm^3$, and/or less than $1\times10^{18}/cm^3$, $1\times10^{19}/cm^3$, $1\times10^{21}/cm^3$. A suitable value for the concentration of carriers in the n-type region includes values greater than $1\times10^{14}/cm^3$, $1\times10^{16}/cm^3$, $1\times10^{17}/cm^3$, and/or less than $1\times10^{18}/cm^3$, $1\times10^{19}/cm^3$, $1\times10^{21}/cm^3$.

The first doped region 32 is in contact with one or more first electrical conductors 44 such as a metal. The second doped region is in contact with one or more second electrical conductors 45 such as a metal. Electrical energy can be applied to the one or more first electrical conductor 44 and the one or more second electrical conductors 45 in a reverse bias so as to form an electrical field in the light-absorbing medium 30. When the electrical field is formed and the light-absorbing material absorbs a light signal, an electrical current flows through the light-absorbing material. As a result, the level of electrical current through the light-absorbing material indicates the intensity of light signals being received by the light-absorbing material.

A light-absorbing medium 30 that is suitable for detection of light signals used in communications applications includes, but is not limited to, germanium, silicon germanium, silicon germanium quantum well, GaAs, and InP. Germanium is suitable for detection of light signals having wavelengths in a range of 1300 nm to 1600 nm.

As is evident from FIG. 1E, the top of the light-absorbing medium 30 can be substantially flush with the top of the light-transmitting medium. Since the light-transmitting medium 18 is located between the base and the light-absorbing medium 30, the thickness of the light-absorbing medium 30 can be less than the thickness of the waveguide (the distance from top of the ridge 22 to the base). Reducing the thickness of the light-absorbing medium 30 increases the speed of the light sensor 29 and may reduce the level dark current associated with the light sensor. Accordingly, the coupling of the light signal from the waveguide into the light-absorbing medium 30 having smaller dimensions than the waveguide allows larger dimension waveguides to be employed while retaining the performance level of a light sensor used on a smaller waveguide.

Figure 2:
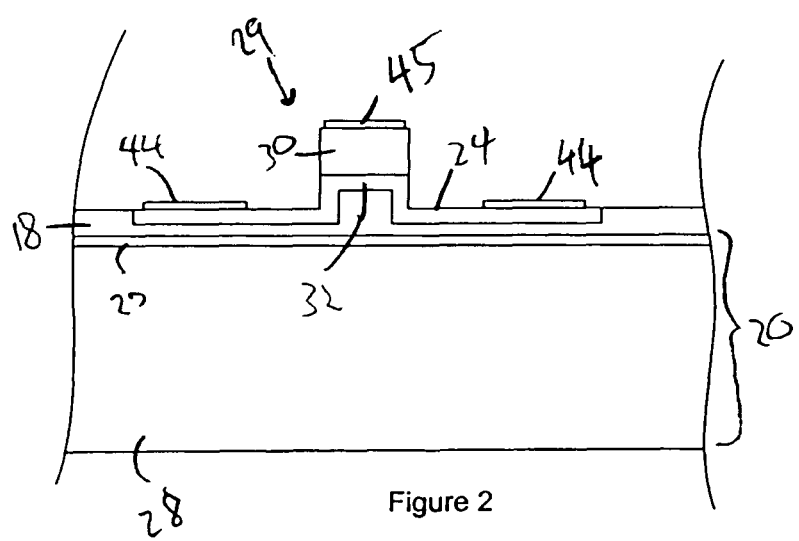
FIG. 2 illustrates the light sensor of FIG. 1A through FIG. 1E constructed without a doped region shown in FIG. 1B.

In some instances, the second doped region 34 is optional. FIG. 2 illustrates the light sensor of FIG. 1A through FIG. 1E constructed without the second doped region. FIG. 2 corresponds to FIG. 1B. The light-absorbing medium 30 excludes the second doped region 34 and the second electrical conductor 45 contacts the light-absorbing medium 30. In this case, generated free carriers are extracted out by the metal-semiconductor-metal junction. In some instances, the embodiment of FIG. 1A through FIG. 1E may be preferred over the embodiment of FIG. 2 because the fabrication is simpler due to a reduced number of doping operations.

Figure 3A:
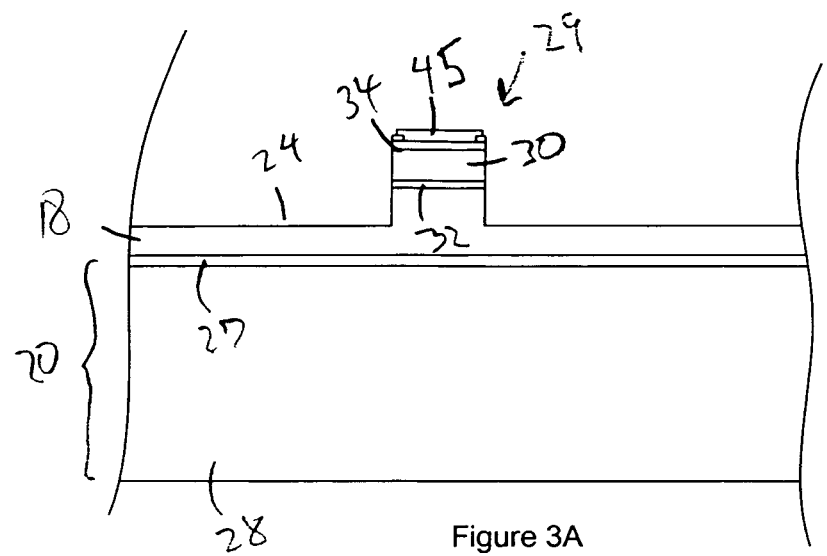
FIG. 3A and FIG. 3B illustrates the light sensor of FIG. 1A through FIG. 1E constructed with one of the doped regions moved from a light-transmitting medium to a light-absorbing medium.

The first doped region 32 is shown above as being located in the light-transmitting medium 18; however, the first doped region 32 can be located in the light-absorbing medium 30. FIG. 3A illustrates the light sensor of FIG. 1A through FIG. 1E constructed with the first doped region 32 located in the light-absorbing medium 30. Such a structure may have lower dark current since the p-i-n junction is formed without including an interface between the light-absorbing medium 30 and the light-transmitting medium 18 where significant dark current can originate. The cross section of FIG. 3A corresponds to the cross section of FIG. 1B. A region of the light-absorbing medium 30 is positioned above the first doped region 32. The first doped region 32 contacts the light-transmitting medium 18.

Figure 3B:
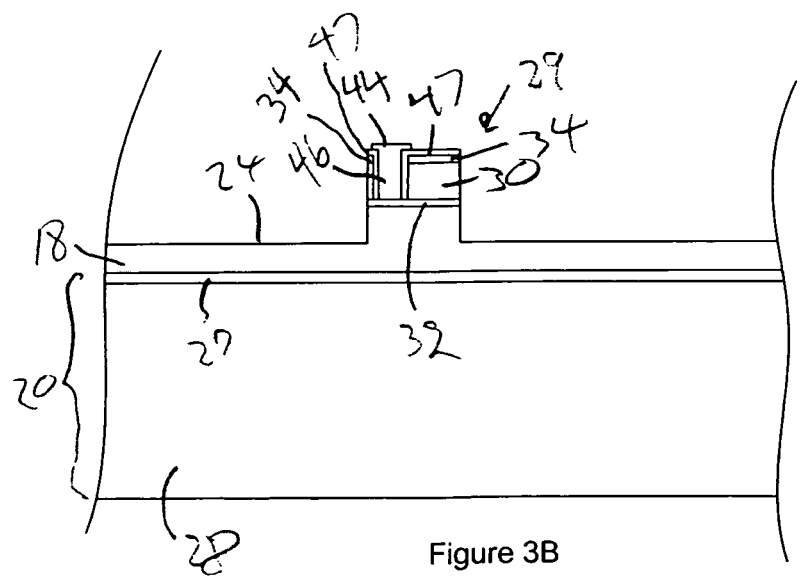

As is evident in FIG. 3A, the second electrical conductor 45 can be employed to apply the electrical energy to the light-absorbing medium 30. As is evident in FIG. 3B, the first electrical conductor 44 can also be positioned over the light-absorbing medium 30 and in electrical communication with the first doped region 32 through a metalized via. For instances, FIG. 3B is a cross section of the light sensor of FIG. 3A taken at a different location than the cross section of FIG. 3A. The first electrical conductor 44 is in electrical communication with a secondary electrical conductor 46 that extends through the second doped region 34, and the light-absorbing medium 30 into contact with the first doped region 32. Accordingly, the secondary electrical conductor 46 provides electrical communication between the first electrical conductor 44 and the first doped region 32. The light sensor can include an insulator 47 configured to stop shorting of the light sensor. The electrical insulator 47 is located between the second doped region 34 and the secondary electrical conductor 46. The electrical insulator 47 is also located between the light-absorbing medium 30 and the secondary electrical conductor 46. As a result, the first electrical conductor 44 can be employed to apply electrical energy to the first doped region 32 of the light-absorbing medium 30. Accordingly, during operation of the light sensor, electrical energy can be applied to the one or more first electrical conductor 44 and the one or more second electrical conductors 45 in a reverse bias so as to form an electrical field in the light-absorbing medium 30. Although not evident from FIG. 3A and FIG. 3B, the first electrical conductor 44 and the one or more second electrical conductors 45 are electrically isolated from one another so the light sensor is not shorted during operation of the light sensor. The electrically isolation can be achieved by spacing the first electrical conductor 44 and the one or more second electrical conductors 45 apart from one another on the top of the light sensor. Suitable electrical insulators include, but are not limited to, silicon nitrides, polymers, and oxides such as an oxide of silicon dioxide, SiON.

Figure 4A:
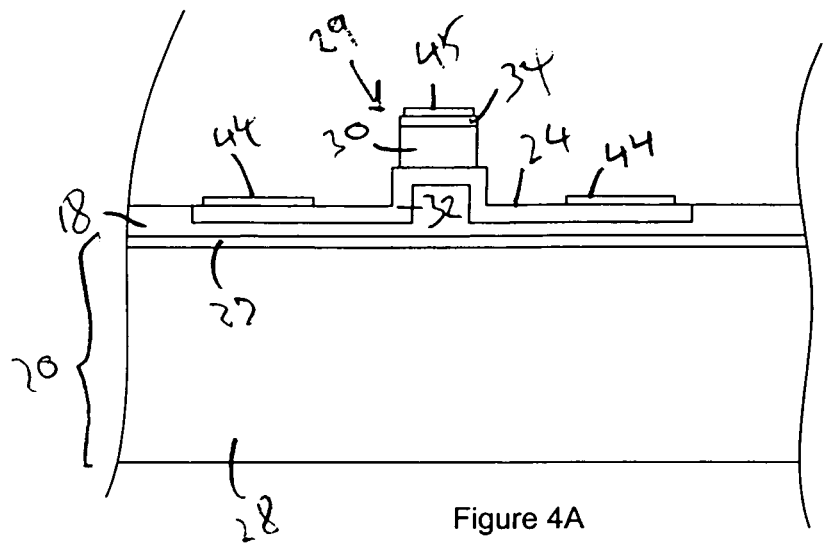
FIG. 4A through FIG. 4C illustrates different arrangements for the light-absorbing medium in the light sensor.
Figure 4B:
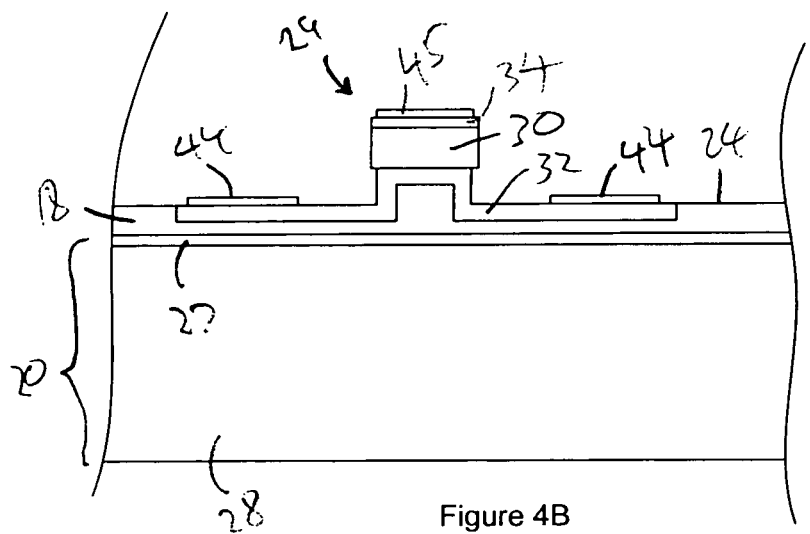
Figure 4C:
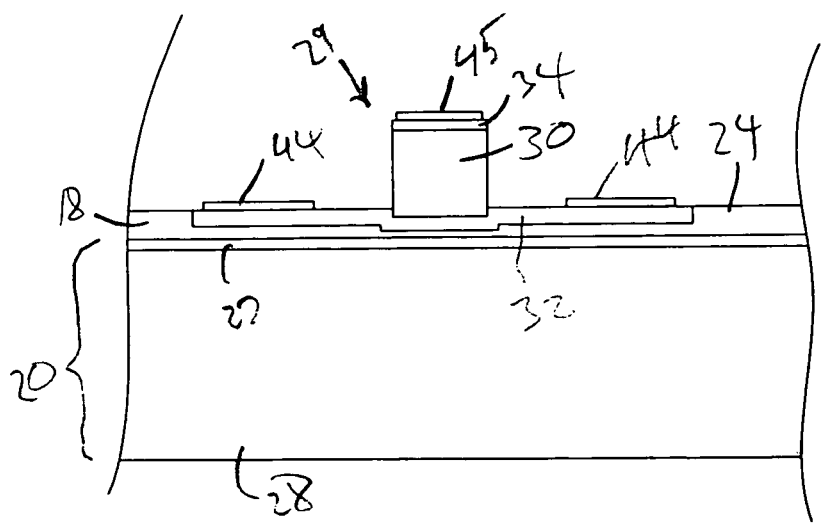

FIG. 4A through FIG. 4C illustrates different arrangements for the light-absorbing medium 30 in the light sensor. FIG. 4A through FIG. 4C are each a cross section of the light sensor such as the cross section shown in FIG. 1B. As shown in FIG. 4A, all or a portion of the light-absorbing medium 30 can be narrower than the underlying ridge of the light-transmitting medium. Alternately, a portion of the light-absorbing medium 30 can be wider than the underlying ridge of the light-transmitting medium as shown in FIG. 4B. In some instances, a portion of the light-absorbing medium 30 is narrower than the underlying ridge of the light-transmitting medium and another portion of the light-absorbing medium 30 is wider than the underlying ridge of the light-transmitting medium. The bottom of the light-absorbing medium 30 can be at or below the slab regions. For instance, FIG. 4C illustrates the light-absorbing medium 30 below the top of the slab regions.

Although FIG. 4A through FIG. 4C illustrate the doped regions and electrical contacts arranged as disclosed in the context of FIG. 1A through FIG. 1E, the doped regions and electrical contacts can be arranged as disclosed in the context of FIG. 2 and/or FIG. 3.

Figure 5A:
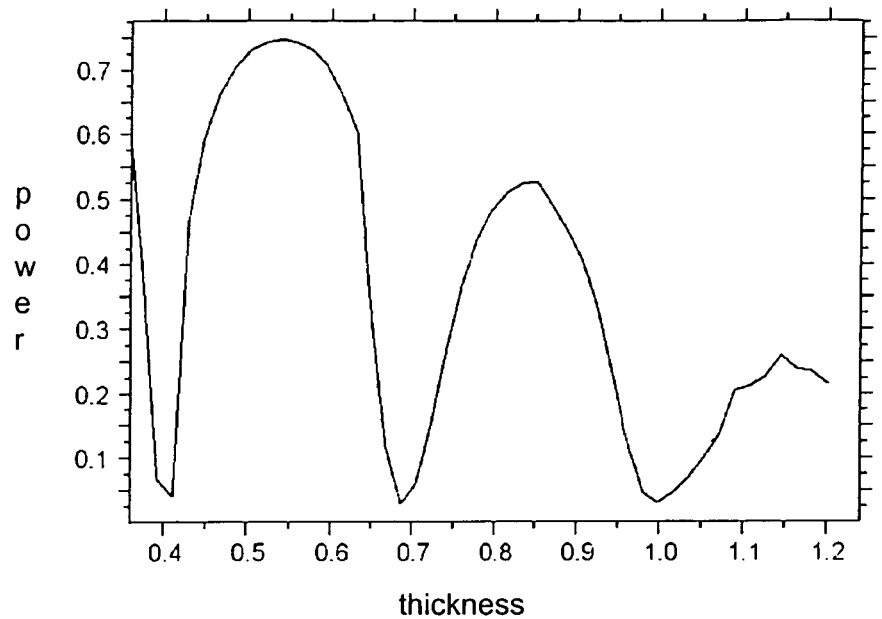
FIG. 5A is a graph showing the power at the end of the light sensor versus the thickness of a light-absorbing medium included in the light sensor.
Figure 5B:
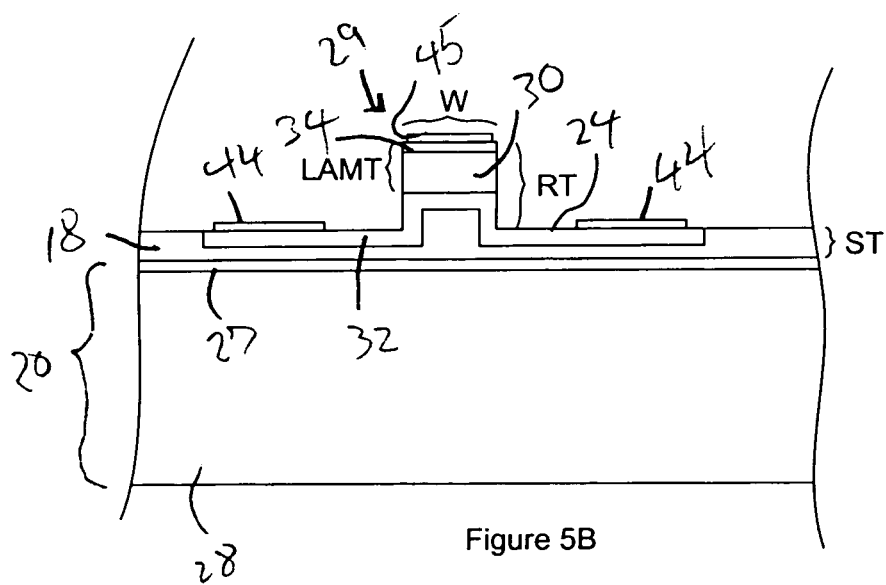
FIG. 5B illustrates the structure of the light sensor used to generate FIG. 5A.

As noted above, the light-absorbing medium 30 is configured such that the portion of the light signal that remains in the light-transmitting medium 18 after the light signal bypasses the facet 31 is coupled into the light-absorbing medium 30. The efficiency at which the light signal is coupled into the light-absorbing medium 30 is a function of the thickness of the light-absorbing medium 30. For instance, FIG. 5A is a graph showing the power at the end of the light sensor versus the thickness of the light-absorbing medium 30. FIG. 5A is generated for a light sensor constructed according to FIG. 5B. The thickness of the slab region (labeled ST in FIG. 5B) is 1.8 μm; the thickness of the ridge (labeled RT in FIG. 5B) is 1.2 μm; the width of the ridge (labeled W in FIG. 5B) is 5 μm; and the length of the light sensor is 150 μm. The variable called thickness in FIG. 5A is labeled LAMT in FIG. 5B.

Reduced power at the end of the light sensor indicates increased absorption of the light signals by the light-absorbing medium 30 and accordingly more efficient coupling of the light signals into the light-absorbing medium 30. Power is coupled efficiently from the light-transmitting medium 18 below the light-absorbing medium 30 when the effective index of refraction of the light-transmitting medium 18 mode matches the effective index of refraction of the light-absorbing medium 30. As a result, the efficiency at which the light signals are coupled into the light-absorbing medium 30 changes in response to changes in the thickness of the light-absorbing medium 30. In fact, the curve shown in FIG. 5A shows multiple minimums.

The thickness of the light-absorbing medium 30 can be selected to achieve the desired level of coupling into the light-absorbing medium 30. For instance, increasing the efficiency at which the light signal is coupled into the light-absorbing medium 30 can reduce the length that is required for the detector to operate at the desired level. As a result, when a short detector is desired, the thickness of the light-absorbing medium 30 can be selected where a curve such as the curve of FIG. 5 is at or near a minimum.

A suitable thickness of the slab region (labeled ST in FIG. 5B) includes, but is not limited to, a thickness greater than 0.1 μm, 0.3 μm, or 0.5 μm and/or less than 5 μm, 8 μm, or 12 μm. A suitable thickness of the ridge (labeled RT in FIG. 5B) includes, but is not limited to, a thickness greater than 0.2 μm, 1 μm, or 3 μm and/or less than 4 μm, 5 μm, or 12 μm. A suitable width of the ridge (labeled W in FIG. 5B) includes, but is not limited to, a width greater than 0.1 μm, 1 μm, or 4 μm and/or less than 5 μm, 6 μm, or 10 μm. A suitable length of the light sensor includes, but is not limited to, a length greater than 1 μm, 10 μm, or 50 μm and/or less than 250 μm, 500 μm, or 5000 μm. The thickness of the light-absorbing medium 30 can be measured relative to the sensor thickness (the thickness of the slab region plus the thickness of the ridge. The thickness of the light-absorbing medium 30 is less than the sensor thickness. For instance, the thickness of the light-absorbing medium 30 can be less than 10% of the sensor thickness, less than 25% of the sensor thickness, or less than 90% of the sensor thickness. In some instances, the thickness of the light-absorbing medium 30 is less than the thickness of the ridge (labeled RT in FIG. 5B). For instance, the thickness of the light-absorbing medium 30 can be less than 20% of the thickness of the ridge, less than 60% of the thickness of the ridge, or less than 90% of the thickness of the ridge. The thickness of the light-absorbing medium 30 can be less than the thickness of the waveguide (the distance between the top of the ridge 22 in FIG. 1C and the insulator 27 in FIG. 1C). For instance, the thickness of the light-absorbing medium 30 can be less than 20% of the waveguide thickness, less than 50% of the waveguide thickness, or less than 70% of the waveguide thickness.

The optical device can be constructed using fabrication technologies that are employed in the fabrication of integrated circuits, optoelectronic circuits, and/or optical devices. FIG. 6A through FIG. 13C illustrate methods for forming optical devices having a light sensor constructed according to FIG. 1A through FIG. 1E. The method is illustrated using a silicon-on-insulator wafer or chip as the starting precursor for the optical device. However, the method can be adapted to platforms other than the silicon-on-insulator platform.

Figure 6A:
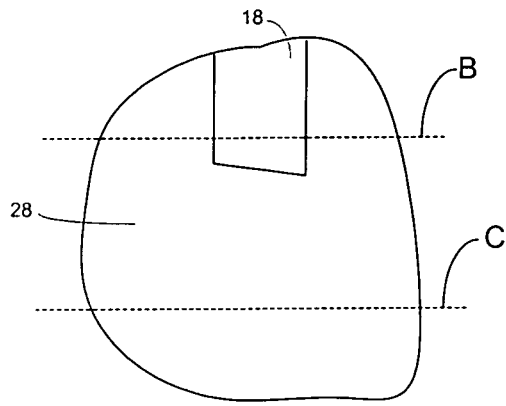
Figure 6B:
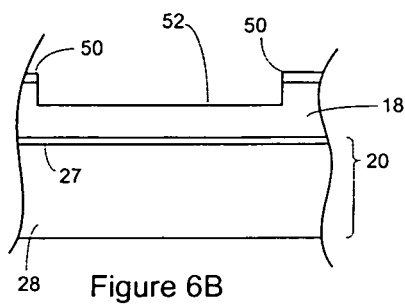
Figure 6C:
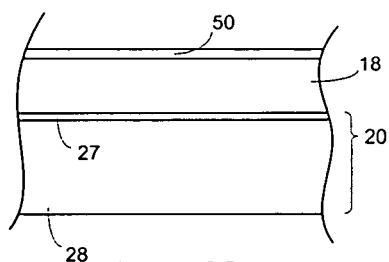

FIG. 6A through FIG. 6C illustrate a first mask 50 formed on the silicon-on-insulator wafer or chip to provide a device precursor. FIG. 6A is a topview of the device precursor. FIG. 6B is a cross-section of the device precursor shown in FIG. 6A taken along the line labeled B. FIG. 6C is a cross-section of the device precursor shown in FIG. 6A taken along the line labeled C. The first mask 50 leaves exposed a region of the device precursor where a sensor cavity 52 is to be formed while the remainder of the illustrated portion of the device precursor is protected. The sensor cavity 52 is the region of the device precursor where the light-absorbing medium 30 is to be formed. A first etch is then performed so as to form the sensor cavity 52. The first etch yields the device precursor of FIG. 6A through FIG. 6C. The first etch is terminated such that the light-transmitting medium at the bottom of the sensor cavity 52 has a thickness that is the sensor thickness minus the light-absorbing material thickness (labeled LAMT in FIG. 5B) that is desired. A suitable first mask 50 includes, but is not limited to, a hard mask such as a silica mask. A suitable first etch includes, but is not limited to, a dry etch.

Figure 7A:
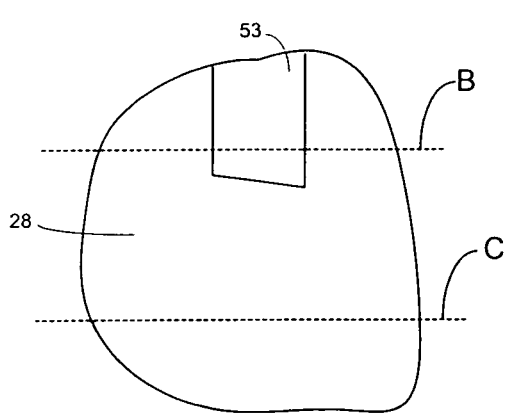
Figure 7B:
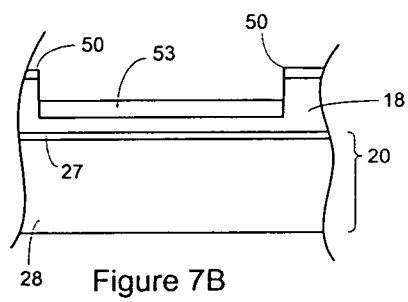
Figure 7C:
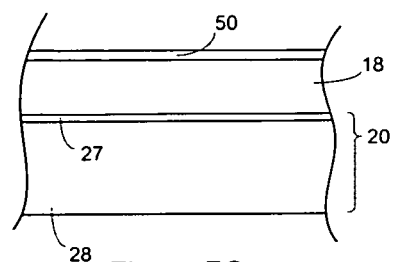

A doped region 53 is formed in the light-transmitting medium at the bottom of the sensor cavity 52A shown in FIG. 6A through FIG. 6C so as to provide the device precursor of FIG. 7A through FIG. 7C. FIG. 7A is a topview of the device precursor. FIG. 7B is a cross-section of the device precursor shown in FIG. 7A taken along the line labeled B. FIG. 7C is a cross-section of the device precursor shown in FIG. 7A taken along the line labeled C. As will become evident below, the doped region 53 will become the first doped region. A suitable method of forming the doped region 53 includes, but is not limited to, dopant implantation, and diffusion. The first mask 50 can serve a mask during the formation of the doped region 53.

Figure 8A:
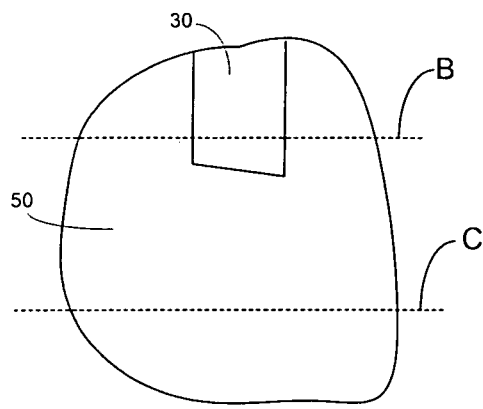
Figure 8B:
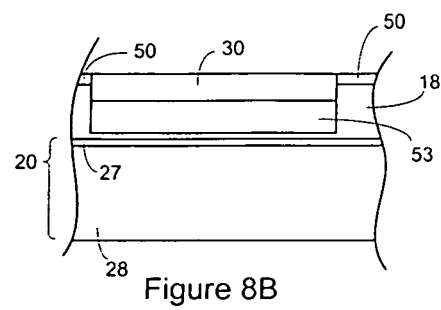
Figure 8C:
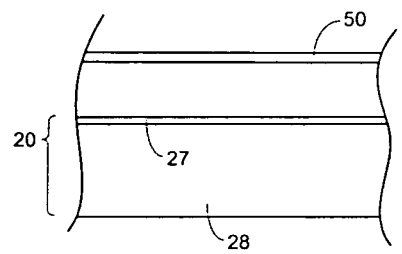

The light-absorbing medium 30 is formed in the sensor cavity 52 of FIG. 7A through FIG. 7C so as to form the device precursor of FIG. 8A through FIG. 8C. FIG. 8A is a topview of the device precursor. FIG. 8B is a cross-section of the device precursor shown in FIG. 8A taken along the line labeled B. FIG. 8C is a cross-section of the device precursor shown in FIG. 8A taken along the line labeled C. When the light-transmitting medium 18 is silicon and the light-absorbing medium 30 is germanium, the germanium can be grown on the doped region 53 of the silicon. After formation of the light light-absorbing medium 30, the device precursor can be planarized to provide the device precursor of FIG. 8A through FIG. 8C.

Figure 9A:
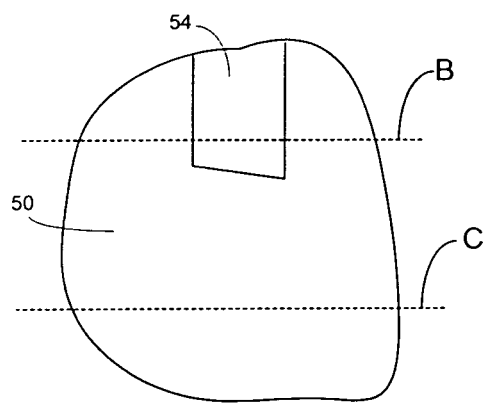
Figure 9B:
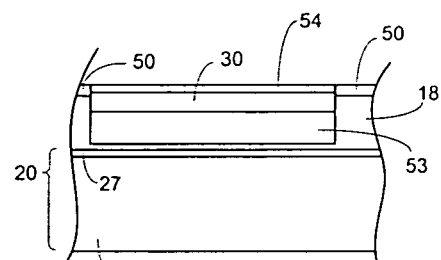
Figure 9C:
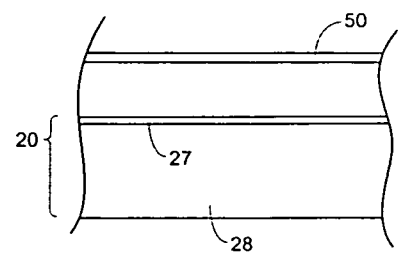

A doped region 54 is formed in the light-absorbing medium 30 of FIG. 8A through FIG. 8C so as to provide the device precursor of FIG. 9A through FIG. 9C. As will become evident below, the doped region 54 will become the second doped region 34. A suitable method of forming the doped region 54 includes, but is not limited to, dopant implantation, in-situ doping during epixy growth, and difusion The first mask 50 can serve a mask during the formation of the doped region 54.

The first mask 50 can be removed from the device precursor of FIG. 9A through FIG. 9C and a second mask 55 can be formed on the device precursor so as to provide the device precursor of FIG. 10A through FIG. 10C. FIG. 10A is a topview of the device precursor. FIG. 10B is a cross-section of the device precursor shown in FIG. 10A taken along the line labeled B. FIG. 10C is a cross-section of the device precursor shown in FIG. 10A taken along the line labeled C. The second mask 55 is formed such that the regions where the trenches 24 are to be formed remain exposed while protecting the remainder of the illustrated portion of the device precursor. A suitable second mask 55 includes a hard mask such as a silica mask.

A second etch is performed on the device precursor of FIG. 10A through FIG. 10C to provide the device precursor of FIG. 11A through FIG. 11C. FIG. 11A is a topview of the device precursor. FIG. 11B is a cross-section of the device precursor shown in FIG. 11A taken along the line labeled B. FIG. 11C is a cross-section of the device precursor shown in FIG. 11A taken along the line labeled C. The second etch is stopped when the trenches 24 in the light sensor have reaches the desired depth. As is evident from FIG. 11B, the second etch forms the second doped region 34 from the doped region 54 and the first doped region 32 from the doped region 52. Since the second etch etches the light-transmitting medium 18 and the light-absorbing medium 30 concurrently, the second etch etches the light-transmitting medium 18 and the light-absorbing medium 30 to different depths. For instance, FIG. 11B illustrates the light-absorbing medium 30 etched deeper than the light-transmitting medium 18. A suitable second etch includes, but is not limited to, a dry etch that can etch both the light-transmitting medium 18 and the light-absorbing medium 30.

Figure 12A:
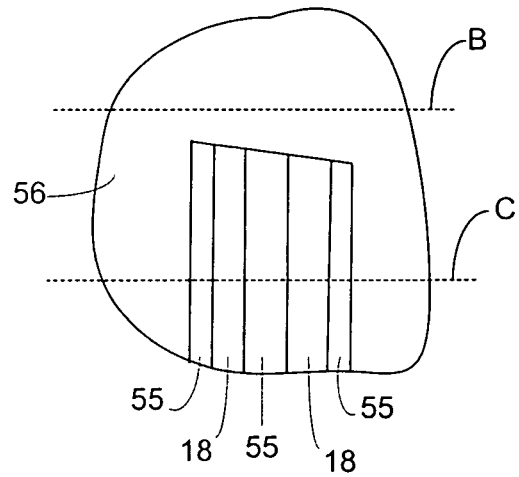
Figure 12B:
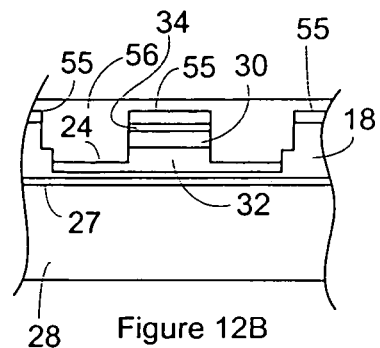
Figure 12C:
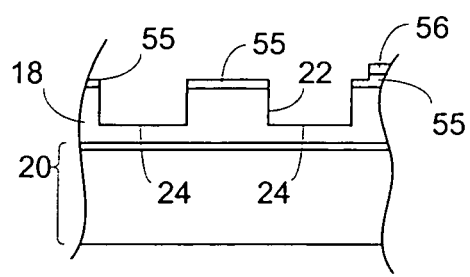

A third mask 56 is formed on the device precursor of FIG. 11A through FIG. 11C so as to form the device precursor of FIG. 12A through FIG. 12C. FIG. 12A is a topview of the device precursor. FIG. 12B is a cross-section of the device precursor shown in FIG. 12A taken along the line labeled B. FIG. 12C is a cross-section of the device precursor shown in FIG. 12A taken along the line labeled C. Portions of the third mask 56 are formed over the second mask 55. The third mask 56 is formed such that the combination of the second mask 55 and the third mask 56 leave the trenches 24 associated with the waveguide 16 exposed while the remainder of the illustrated portion of the device precursor is protected. For instance, the trenches 24 in the light sensor are protected. A third etch is then performed so as to provide the device precursor of FIG. 12A through FIG. 12C. The third etch is performed such that the trenches 24 associated with the waveguide 16 and the trenches in the light sensor are etched to about the same depth. As a result, the third etch corrects for the depth differential that is evident in FIG. 11B and FIG. 11C. A suitable third mask 56 includes, but is not limited to, a photoresist. A suitable third etch includes, but is not limited to, a dry etch.

Figure 13A:
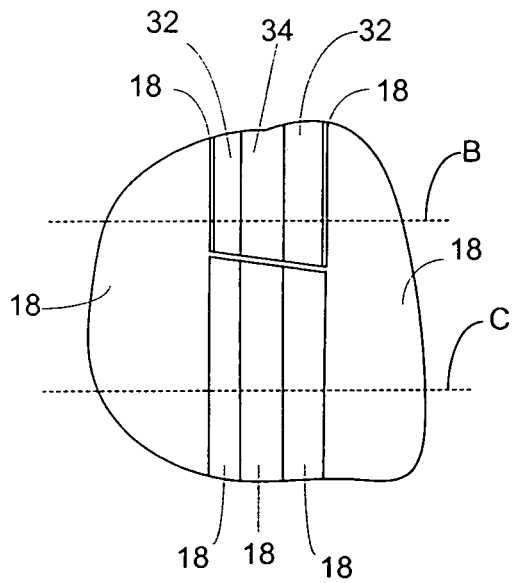
Figure 13B:
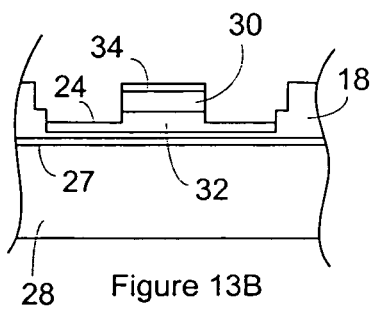
Figure 13C:
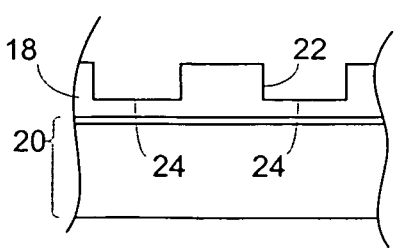

The third mask 56 and the second mask 55 are removed so as to provide the device precursor of FIG. 13A through FIG. 13C. FIG. 13A is a topview of the device precursor. FIG. 13B is a cross-section of the device precursor shown in FIG. 13A taken along the line labeled B. FIG. 13C is a cross-section of the device precursor shown in FIG. 13A taken along the line labeled C. Additional features of the optical device such as electrical contacts and cladding can be constructed using fabrication technologies that are employed in the fabrication of integrated circuits, optoelectronic circuits, and/or optical devices.

The method of FIG. 6A through FIG. 13C can be adapted to form other light sensors. For instance, the formation of the doped region 53 disclosed in the context of FIG. 9A through FIG. 9C can be skipped in order to form a light sensor according to FIG. 2. Additionally or alternately, formation of the doped region 53 as disclosed in FIG. 7A through FIG. 7C can be skipped. The formation of the light-absorbing medium disclosed in FIG. 8A through FIG. 8C can be done in stages and the doped region 53 can be formed in one of the early stages in order to provide the first doped region 32 located in the light-absorbing medium rather than the light-transmitting medium as illustrated in FIG. 3A and FIG. 3B. After removal of the second mask 55 and the third mask 56, additional features of the optical device such as electrical contacts and cladding can be constructed using fabrication technologies that are employed in the fabrication of integrated circuits, optoelectronic circuits, and/or optical devices. For instance, metallized via formation techniques can be employed to form the metallized via of FIG. 3B.

Suitable electronics for operating the above light sensors can include a controller. A suitable controller includes, but is not limited to, a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions attributed to the electronics. A general-purpose processor may be a microprocessor, but in the alternative, the controller may include or consist of any conventional processor, microcontroller, or state machine. A controller may also be implemented as a combination of computing devices, e.g., a combination of a DSP and a microprocessor, a plurality of microprocessors, one or more microprocessors in conjunction with a DSP core, or any other such configuration.

The electronics can optionally include a memory in communication with the controller. The electronics can store data for executing the functions of the electronics in the memory. The memory can be any memory device or combination of memory devices suitable for read and/or write operations.

In some instances, the electronics include a computer-readable medium in communication with the controller. The computer-readable medium can have a set of instructions to be executed by the controller. The controller can read and execute instructions included on the computer-readable medium. The controller executes the instructions such that the electronics perform one or more of the described functions. The computer-readable medium cab be different from the memory or can be the same as the memory. Suitable computer-readable media include, but are not limited to, optical discs such as CDs, magnetic storage diskettes, Zip disks, magnetic tapes, RAMs, and ROMs. Some functions of the electronics may be executed using hardware as opposed to executing these functions in firmware and/or software.

Although the optical device is shown without an output waveguide that carries light signals that pass through the light sensor away from the light sensor, the optical device can include an output waveguide that carries light signals that pass through the light sensor away from the light sensor. The output waveguide can be constructed according to FIG. 1C.

Other embodiments, combinations and modifications of this invention will occur readily to those of ordinary skill in the art in view of these teachings. Therefore, this invention is to be limited only by the following claims, which include all such embodiments and modifications when viewed in conjunction with the above specification and accompanying drawings.

The invention claimed is:

1. An optical device, comprising:
a light-transmitting medium positioned on a base;
a light sensor positioned on the base, the light sensor including a continuous light-absorbing medium positioned on the base,
the light-transmitting medium defining a waveguide,
a portion of the waveguide ending at a facet such that a first portion of a light signal guided by the waveguide is received by the light-absorbing medium after exiting from the waveguide through the facet, and
a second portion of the light signal bypasses the facet when traveling from the waveguide into an underlying portion of the light-transmitting medium, the underlying portion of the light-transmitting medium being between the light-absorbing medium and the base, and
the light-absorbing medium configured such that the second portion of the light signal is coupled into the light-absorbing medium from the underlying portion of the light-transmitting medium.

2. The device of claim 1, wherein the light-absorbing medium includes a second facet that contacts the facet of the waveguide.

3. The device of claim 1, wherein a first doped region is positioned in a portion of the light-transmitting medium that is located between the light-absorbing medium and the base.

4. The device of claim 3, wherein the first doped region contacts the light-absorbing medium.

5. The device of claim 4, wherein the light-absorbing medium includes a second doped region.

6. The device of claim 5, wherein the second doped region is arranged such that a portion of the light-absorbing medium is located between the second doped region and the first doped region.

7. The device of claim 6, wherein the portion of the light-absorbing medium is between the second doped region and the light-transmitting medium.

8. The device of claim 7, wherein the second doped region contacts the top of the light-absorbing medium.

9. The device of claim 1, wherein the light absorbing medium includes a first doped region and a second region and the first doped region is located between the second region of the light absorbing medium and the base.

10. The device of claim 9, wherein the first doped region contacts the light-transmitting medium.

11. The device of claim 10, wherein the light-absorbing medium includes a second doped region and the second region of the light absorbing medium is between the first doped region and the second doped region.

12. The device of claim 11, wherein the second doped region contacts the top of the light-absorbing medium.

13. The device of claim 1, further comprising:
electronics configured to apply electrical energy to the light-absorbing medium in a reverse bias so as to form an electrical field in the light-absorbing medium.

14. The device of claim 1, wherein the waveguide is not located between the light-absorbing medium and the base.

15. The device of claim 1, wherein the second portion of the light signal bypasses the facet without traveling through the facet.

16. The device of claim 1, wherein the portion of the light-transmitting medium that define the waveguide is continuous with the light-transmitting medium.

17. The device of claim 1, wherein the facet of the waveguide is a facet of the light-transmitting medium and the second portion of the light signal travels between the facet of the light-transmitting medium and the base when bypassing the facet of the light-transmitting medium.

* * * * *